(12) United States Patent
 Takeshita

(10) Patent No.: US 11,621,693 B2
(45) Date of Patent: Apr. 4, 2023

(54) ACOUSTIC WAVE DEVICE

(71) Applicant: Murata Manufacturing Co., Ltd., Nagaokakyo (JP)

(72) Inventor: Toru Takeshita, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 972 days.

(21) Appl. No.: 15/929,140

(22) Filed: Jun. 6, 2019

(65) Prior Publication Data

US 2019/0288666 A1    Sep. 19, 2019

Related U.S. Application Data

(63) Continuation of application No. PCT/JP2017/044243, filed on Dec. 8, 2017.

(30) Foreign Application Priority Data

Dec. 15, 2016  (JP) .............................. JP2016-243531

(51) Int. Cl.
 *H03H 9/02* (2006.01)
 *H03H 9/145* (2006.01)
 (Continued)

(52) U.S. Cl.
 CPC .... *H03H 9/02897* (2013.01); *H03H 9/02559* (2013.01); *H03H 9/059* (2013.01);
 (Continued)

(58) Field of Classification Search
 CPC .. H03H 9/02614; H03H 9/02055; H03H 9/25; H03H 9/145; H03H 9/1092;
 (Continued)

(56) References Cited

U.S. PATENT DOCUMENTS

2007/0252481 A1\* 11/2007 Iwamoto .............. H03H 9/1092
   310/344
2008/0308223 A1   12/2008 Sakairi et al.
   (Continued)

FOREIGN PATENT DOCUMENTS

JP         51-4240 U     1/1976
JP      2005-223580 A    8/2005
   (Continued)

OTHER PUBLICATIONS

Official Communication issued in International Patent Application No. PCT/JP2017/044243, dated Feb. 6, 2018.

*Primary Examiner* — J. San Martin
(74) *Attorney, Agent, or Firm* — Keating & Bennett, LLP

(57) ABSTRACT

An acoustic wave device includes an element substrate having piezoelectricity, an interdigital transducer electrode provided on the element substrate, and a mold resin covering the element substrate. When viewed in a cross section, the element substrate includes an interdigital transducer formation region in which the interdigital transducer electrode is provided and a pair of interdigital transducer non-formation regions in which the interdigital transducer electrode is not provided and located on both sides of the interdigital transducer formation region, and a thickness dimension of a center portion, in a width direction, of the interdigital transducer formation region is less than at least one of thickness dimensions of center portions, in the width direction, of the interdigital transducer non-formation regions.

19 Claims, 3 Drawing Sheets

(51) Int. Cl.
    *H03H 9/05*          (2006.01)
    *H03H 9/10*          (2006.01)
    *H03H 9/25*          (2006.01)
    *H01L 41/047*       (2006.01)

(52) U.S. Cl.
    CPC .......... *H03H 9/1092* (2013.01); *H03H 9/145* (2013.01); *H03H 9/25* (2013.01); *H01L 41/0477* (2013.01)

(58) Field of Classification Search
    CPC ............... H03H 9/059; H03H 9/02559; H03H 9/02897; H01L 41/0477
    See application file for complete search history.

(56) References Cited

U.S. PATENT DOCUMENTS

2010/0289600 A1    11/2010    Takada et al.
2017/0358730 A1*  12/2017    Kishimoto ......... H03H 9/02614
2018/0337657 A1*  11/2018    Ruby ....................... H03H 9/64

FOREIGN PATENT DOCUMENTS

| | | | |
|---|---|---|---|
| JP | 2008205872 A | * | 9/2008 |
| JP | 2009-021559 A | | 1/2009 |
| JP | 2010251827 A | * | 11/2010 |
| JP | 2014-112607 A | | 6/2014 |
| WO | 2009/104438 A1 | | 8/2009 |

\* cited by examiner

ACOUSTIC WAVE DEVICE

CROSS REFERENCE TO RELATED APPLICATIONS

This application claims the benefit of priority to Japanese Patent Application No. 2016-243531 filed on Dec. 15, 2016 and is a Continuation Application of PCT Application No. PCT/JP2017/044243 filed on Dec. 8, 2017. The entire contents of each application are hereby incorporated herein by reference.

BACKGROUND OF THE INVENTION

1. Field of the Invention

The present invention relates to an acoustic wave device.

2. Description of the Related Art

In some acoustic wave devices, a mold resin covers an element substrate on which an IDT (interdigital transducer) electrode is formed, to protect the element substrate or permit printing thereon. For example, Japanese Unexamined Patent Application Publication No. 2009-021559 describes such an acoustic wave device. FIG. 5 shows an acoustic wave device 1100 described in Japanese Unexamined Patent Application Publication No. 2009-021559.

In the acoustic wave device 1100, an element substrate (SAW chip) 103 on which an interdigital transducer electrode 104 is formed is mounted on a mounting substrate (ceramic substrate) 101. Specifically, the element substrate 103 is bonded by bumps (gold bumps) 105 to mounting electrodes 102 formed on the mounting substrate 101. A mold resin 106 covers the element substrate 103.

The mold resin 106 protects the element substrate 103 from external environments. The mold resin 106 also defines and functions as a portion to be attracted when the acoustic wave device 1100 is suctioned by a vacuum and mounted with a mounter. When the acoustic wave device 1100 is suctioned by a vacuum with a mounter, impact may be exerted on the acoustic wave device 1100. The mold resin 106 also defines and functions as an impact absorbing material that protects the element substrate 103 from the impact.

Furthermore, the mold resin 106 defines and functions as a printed portion in which information, such as type, product number, production date, production lot, and directivity, is printed (affixed) on the acoustic wave device 1100. Printing of information with a method using laser irradiation is easy and highly productive, so it is generally used. However, when the element substrate 103 is made of lithium tantalate monocrystal, lithium niobate monocrystal, or the like, the element substrate 103 melts when printing is applied to the top surface of the element substrate 103 with laser irradiation, so printing cannot be performed with laser irradiation. Therefore, in the acoustic wave device 1100, the element substrate 103 is covered with the mold resin 106, and then printing is applied to the top surface of the mold resin 106 with laser irradiation.

In the acoustic wave device 1100 described in Japanese Unexamined Patent Application Publication No. 2009-021559, both of the top surface of the mold resin 106 and the top surface of the element substrate 103 are flat, and the top surface of the mold resin 106 and the top surface of the element substrate 103 are parallel to each other.

On the other hand, as described above, since the mold resin 106 is provided to protect the element substrate 103 from external environments or to be suctioned by a vacuum with a mounter or to undergo printing of information thereon, the distance between the top surface of the mold resin 106 and the top surface of the element substrate 103 needs to be greater than or equal to a certain distance.

That is, when the distance between the top surface of the mold resin 106 and the top surface of the element substrate 103 is less than a predetermined distance, the element substrate 103 may break on impact when suctioned by a vacuum with a mounter. In addition, when the distance between the top surface of the mold resin 106 and the top surface of the element substrate 103 is less than the predetermined distance, laser irradiation may reach the element substrate 103 and melt the element substrate 103 when information is printed on the top surface of the mold resin 106 with laser irradiation.

Therefore, it has been difficult for the acoustic wave device 1100 to have a reduced distance between the top surface of the mold resin 106 and the top surface of the element substrate 103 and, as a result, have a reduced height dimension, that is, a low profile.

SUMMARY OF THE INVENTION

Preferred embodiments of the present invention provide acoustic wave devices that each include an element substrate having piezoelectricity and including a first main surface and a second main surface, an interdigital transducer electrode provided on the first main surface of the element substrate, and a mold resin covering at least the second main surface of the element substrate. The second main surface of the element substrate is not flat. When viewed in a cross section perpendicular or substantially perpendicular to a top surface of the mold resin, the element substrate includes an interdigital transducer formation region in which the interdigital transducer electrode is provided and a pair of interdigital transducer non-formation regions in which the interdigital transducer electrode is not provided, the interdigital transducer non-formation regions being located on both sides of the interdigital transducer formation region, and a thickness dimension of a center portion, in a width direction, of the interdigital transducer formation region of the element substrate is less than at least one of a thickness dimension of a center portion, in the width direction, of one of the interdigital transducer non-formation regions of the element substrate and a thickness dimension of a center portion, in the width direction, of the other one of the interdigital transducer non-formation regions of the element substrate.

Since the interdigital transducer electrode is normally disposed near a center of the first main surface of the element substrate (the interdigital transducer electrode is not disposed eccentrically to a periphery of the first main surface of the element substrate), when the element substrate is viewed in the cross section, the interdigital transducer non-formation regions are disposed on both sides of the interdigital transducer formation region of the element substrate. The cross section may be any cross section as long as the cross section is perpendicular or substantially perpendicular to the top surface of the mold resin. For example, the cross section may be a cross section perpendicular or substantially perpendicular to a direction in which comb teeth of the interdigital transducer electrode extend, or may be a cross section parallel or substantially parallel to the direction in which the comb teeth of the interdigital transducer electrode extend, or may be another cross section.

Preferably, the thickness dimension of the center portion, in the width direction, of the interdigital transducer formation region of the element substrate is less than the thickness dimension of the center portion, in the width direction, of the one of the interdigital transducer non-formation regions of the element substrate and the thickness dimension of the center portion, in the width direction, of the other one of the interdigital transducer non-formation regions of the element substrate. This is because, in this case, the cross section of the element substrate is bilaterally symmetric and, therefore, the mechanical strength of the element substrate is improved and the electrical characteristics of the acoustic wave device are stable.

Preferably, the top surface of the mold resin is flat. This is because, in this case, it is easy to apply printing to the top surface or suction to the top surface by a vacuum with a mounter.

In an acoustic wave device according to a preferred embodiment of the present invention, since the thickness dimension in the interdigital transducer formation region of the element substrate is less than the thickness dimension in the interdigital transducer non-formation regions, even when the overall dimension in the height direction is reduced (the overall device has a low profile) by reducing the thickness dimension of the mold resin, a sufficiently large distance from the top surface of the mold resin to the second main surface of the element substrate in the interdigital transducer formation region is ensured. For this reason, even when printing is applied with laser irradiation to the top surface of the mold resin, corresponding to the interdigital transducer formation region of the element substrate, laser irradiation does not reach the element substrate in the interdigital transducer formation region, and the element substrate does not melt.

The element substrate may be made of lithium tantalate monocrystal or lithium niobate monocrystal. As described above, in an acoustic wave device according to a preferred embodiment of the present invention, since the thickness dimension in the interdigital transducer formation region of the element substrate is small, even when the overall dimension in the height direction is reduced by reducing the thickness dimension of the mold resin, a sufficiently large distance from the top surface of the mold resin to the second main surface of the element substrate in the interdigital transducer formation region is ensured. For this reason, even when the element substrate is made of lithium tantalate monocrystal or lithium niobate monocrystal, laser irradiation does not reach the element substrate in the interdigital transducer formation region, and the element substrate does not melt.

An acoustic wave device according to a preferred embodiment of the present invention may further include a cover layer. The cover layer may be disposed to face the first main surface of the element substrate, and a gap may be provided between the cover layer and the interdigital transducer electrode. In this case, since the interdigital transducer electrode is protected by the gap, the function of the interdigital transducer electrode is not impaired by the mold resin.

An acoustic wave device according to a preferred embodiment of the present invention may further include a mounting substrate. The element substrate may be mounted on the mounting substrate, and then the mold resin may be provided to cover the element substrate. In this case, the element substrate is easily covered with the mold resin.

In an acoustic wave device according to a preferred embodiment of the present invention, the thickness dimension of the element substrate is partially reduced in the interdigital transducer formation region. When the thickness dimension of the element substrate is reduced over the entire or substantially the entire element substrate, the mechanical strength of the element substrate is decreased. However, in the acoustic wave device of the present preferred embodiment, since the thickness dimension of the element substrate is partially reduced, required mechanical strength is ensured.

In an acoustic wave device according to a preferred embodiment of the present invention, since the thickness dimension in the interdigital transducer formation region of the element substrate is less than the thickness dimension in the interdigital transducer non-formation regions, even when the overall dimension in the height direction is reduced by reducing the thickness dimension of the mold resin, a sufficiently large distance from the top surface of the mold resin to the second main surface of the element substrate in the interdigital transducer formation region is ensured. That is, with an acoustic wave device according to a preferred embodiment of the present invention, the dimension of the acoustic wave device in the height direction is able to be reduced without reducing the distance from the top surface of the mold resin to the second main surface of the element substrate in the interdigital transducer formation region.

In an acoustic wave device according to a preferred embodiment of the present invention, even when the overall dimension in the height direction is reduced by reducing the thickness dimension of the mold resin, a sufficiently large distance from the top surface of the mold resin to the second main surface of the element substrate in the interdigital transducer formation region is ensured. Therefore, even when impact is exerted on the top surface of the mold resin, corresponding to the interdigital transducer formation region, when the device is suctioned by a vacuum with a mounter, the impact is absorbed by the mold resin, and the element substrate does not break. In addition, in an acoustic wave device according to a preferred embodiment of the present invention, even when the overall dimension in the height direction is reduced by reducing the thickness dimension of the mold resin, a sufficiently large distance from the top surface of the mold resin to the second main surface of the element substrate in the interdigital transducer formation region is ensured. Therefore, even when information is printed on the top surface of the mold resin, corresponding to the interdigital transducer formation region, with laser irradiation, laser irradiation does not reach the element substrate, so the element substrate does not melt or the interdigital transducer electrode does not break.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
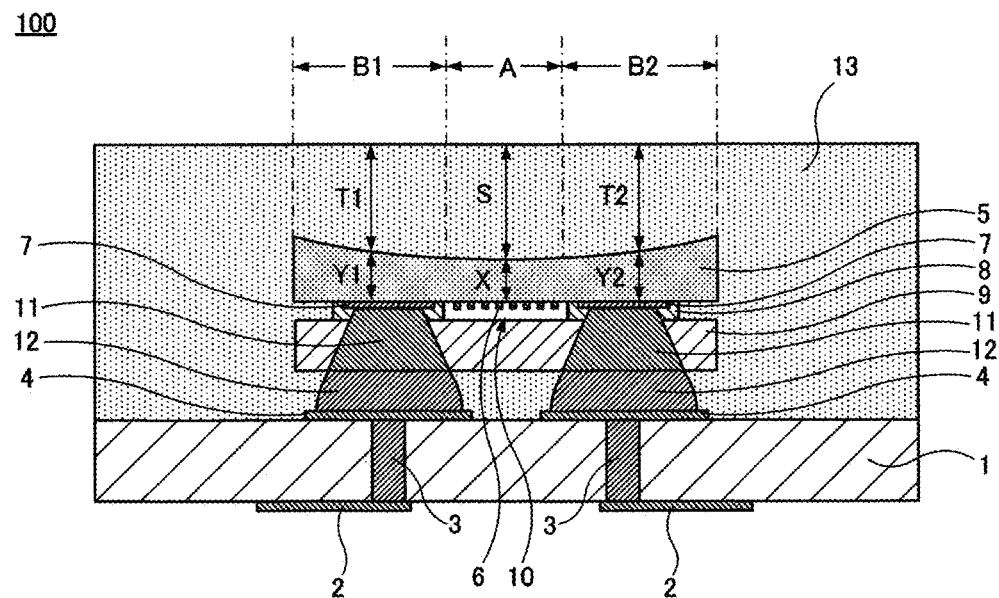
FIG. 1 is a cross-sectional view showing an acoustic wave device 100 according to a first preferred embodiment of the present invention.

Hereinafter, preferred embodiments of the present invention will be described below with reference to the accompanying drawings.

The present invention is not limited to the details of the preferred embodiments of the present invention described below. Combinations of the details described in different preferred embodiments are applicable. The present invention also encompasses the details of those combinations in this case. The drawings are intended to facilitate understanding of the specification, and may be drawn schematically. The ratios of dimensions of the drawn components or dimensions between the components may not correspond to the ratios of dimensions of those described in the specification. The components described in the specification may be, for example, not shown in the drawings or drawn in less number.

First Preferred Embodiment

FIG. 1 shows an acoustic wave device 100 according to a first preferred embodiment of the present invention. FIG. 1 is a cross-sectional view of the acoustic wave device 100.

The acoustic wave device 100 includes a mounting substrate 1. In the present preferred embodiment, the mounting substrate 1 is preferably made of ceramics, more specifically, alumina, for example. The material of the mounting substrate 1 is selectable. The mounting substrate 1 may be made of ceramics other than alumina or may be made of glass ceramics, resin, or another material, instead of ceramics, for example.

Outer electrodes 2 are provided on a lower main surface of the mounting substrate 1. Via conductors 3 are provided in the mounting substrate 1. Mounting electrodes 4 are provided on an upper main surface of the mounting substrate 1. The outer electrodes 2 and the mounting electrodes 4 are connected by the via conductors 3. The outer electrodes 2, the via conductors 3, and the mounting electrodes 4 are preferably made of, for example, silver, copper, or another suitable material.

The acoustic wave device 100 includes an element substrate 5 having piezoelectricity. In the present preferred embodiment, 42-degree cut LT (lithium tantalate monocrystal) substrate, for example, is preferably used as the element substrate 5. The type of the element substrate 5 is selectable. The element substrate 5 may be, for example, an LN (lithium niobate monocrystal) substrate, a quartz substrate, or another substrate, instead of the LT substrate. The substrate just needs to be a substrate having piezoelectricity at least at its surface. For example, the substrate may be a multilayer body including a piezoelectric thin film at its surface, a film having an acoustic velocity different from that of the piezoelectric thin film, a support substrate, and other suitable substrate.

The element substrate 5 includes a first main surface (lower main surface) and a second main surface (upper main surface).

An interdigital transducer electrode 6 and terminal electrodes 7 are provided on the first main surface of the element substrate 5. The material of the interdigital transducer electrode is selectable. The interdigital transducer electrode 6 is preferably made of, for example, a metal selected from among Pt, Au, Ag, Cu, Ni, W, Ta, Fe, Cr, Al, and Pd, or an alloy containing at least one of these metals. The interdigital transducer electrode 6 may have a multilayer structure including multiple types of the above-described metals and alloys. The material of the terminal electrodes 7 is selectable. The terminal electrodes 7 are preferably made of, for example, aluminum. Although not shown in the drawing, the interdigital transducer electrode 6 and the terminal electrodes 7 are connected by wiring electrodes.

An annular support layer 8 is provided on the first main surface of the element substrate 5. The support layer 8 is preferably made of, for example, photosensitive polyimide. The support layer 8 surrounds the interdigital transducer electrode 6 on the first main surface of the element substrate 5. The support layer 8 is provided on the terminal electrodes 7 over the first main surface of the element substrate 5.

A cover layer 9 is provided on the support layer 8. A film made of epoxy resin, for example, is preferably used as the cover layer 9.

A gap 10 is provided by the first main surface of the element substrate 5, the annular support layer 8, and the cover layer 9. The interdigital transducer electrode 6 is disposed in the gap 10. Since the interdigital transducer electrode 6 is disposed in the gap 10, vibrations of the interdigital transducer electrode 6 are not impaired by a mold resin 13 (described later).

Through-holes extend through the cover layer 9 and the support layer 8, and are filled with an electrically conductive substance, with the result that UBMs (under bump metals) 11 are provided. The UBMs 11 are preferably mainly made of, for example, nickel.

Each UBM 11 and a corresponding one of the mounting electrodes 4 of the mounting substrate 1 are bonded by a bump 12. As a result, the element substrate 5 to which the cover layer 9 is attached is mounted on the mounting substrate 1. In the present preferred embodiment, solder bumps, for example, are preferably used as the bumps 12. The type of the bumps 12 is selectable. The bumps 12 may be gold bumps, or other suitable bumps, instead of the solder bumps.

The mold resin 13 is provided on the mounting substrate 1 so as to cover the element substrate 5. In the present preferred embodiment, the material of the mold resin 13 is preferably epoxy resin, for example. The material of the mold resin 13 is selectable, and may be, for example, polyimide resin or another resin.

Although not shown in the drawing, numbers, symbols, characters, or other information, are printed (affixed) with laser irradiation on the top surface of the mold resin 13. The numbers, symbols, and characters indicate, for example, information such as the type, product number, production date, production lot, and directivity of the acoustic wave device 100.

For example, as shown in FIG. 1, when viewed in the cross section of the acoustic wave device 100, taken perpendicularly or substantially perpendicularly to the top surface of the mold resin 13, the element substrate 5 includes an interdigital transducer formation region A in which the interdigital transducer electrode 6 is provided and a pair of interdigital transducer non-formation regions B1, B2 in which the interdigital transducer electrode 6 is not provided.

The interdigital transducer non-formation regions B1, B2 are disposed on both sides of the interdigital transducer formation region A.

In the acoustic wave device 100, the top surface of the mold resin 13 is flat. On the other hand, the second main surface (upper main surface) of the element substrate 5 is not flat.

In the element substrate 5 of the acoustic wave device 100, a thickness dimension X of a center portion, in the width direction, of the interdigital transducer formation region A is less than a thickness dimension Y1 of a center portion, in the width direction, of the interdigital transducer non-formation region B1 and is less than a thickness dimension Y2 of a center portion, in the width direction, of the interdigital transducer non-formation region B2. That is, the element substrate 5 is at least partially thinner in the interdigital transducer formation region A than in the other portions.

As a result, in the acoustic wave device 100, a distance S from the top surface of the mold resin 13 to the second main surface of the element substrate 5 at the center portion, in the width direction, of the interdigital transducer formation region A is greater than a distance T1 from the top surface of the mold resin 13 to the second main surface of the element substrate 5 at the center portion, in the width direction, of the interdigital transducer non-formation region B1 and is greater than a distance T2 from the top surface of the mold resin 13 to the second main surface of the element substrate 5 at the center portion, in the width direction, of the interdigital transducer non-formation region B2.

That is, the thickness (height dimension) of the acoustic wave device 100 is reduced by the element substrate 5 having a low profile. However, when the entire or substantially the entire element substrate 5 has a low profile, the mechanical strength of the element substrate 5 is decreased. Therefore, the element substrate 5 is partially structured to have a low profile mainly in the interdigital transducer formation region A. More specifically, since the interdigital transducer non-formation regions B1, B2 of the element substrate 5 are bonded to the cover layer 9 by the support layer 8, at least one of the interdigital transducer non-formation regions B1, B2 needs to have an increased thickness to some extent. On the other hand, the interdigital transducer formation region A of the element substrate 5 is able to have a low profile as long as at least one of the interdigital transducer non-formation regions B1, B2 has a predetermined thickness. Therefore, in the acoustic wave device 100, the element substrate 5 partially has a low profile mainly in the interdigital transducer formation region A.

Even when the acoustic wave device 100 is structured such that the overall dimension in the height direction is reduced by reducing the thickness dimension of the mold resin 13, a sufficiently large distance S from the top surface of the mold resin 13 to the second main surface of the element substrate 5 in the interdigital transducer formation region A is ensured. Therefore, even when information is printed on the top surface corresponding to the interdigital transducer formation region A of the mold resin 13 by laser irradiation, laser irradiation does not reach the element substrate 5, and the interdigital transducer formation region A of the element substrate 5 does not melt. If the interdigital transducer formation region A of the element substrate 5 melts, the acoustic wave device 100 does not satisfy required electrical characteristics and may be a defective product.

Even when the acoustic wave device 100 is structured such that the overall dimension in the height direction is reduced by reducing the thickness dimension of the mold resin 13, a sufficiently large distance S from the top surface of the mold resin 13 to the second main surface of the element substrate 5 in the interdigital transducer formation region A is ensured. Therefore, even when impact is exerted on the acoustic wave device 100 when the device is suctioned by a vacuum with a mounter, the impact is absorbed by the mold resin 13, and the element substrate 5 does not break. Suction by a vacuum with a mounter is normally applied to the central portion of the top surface of the mold resin 13. Therefore, it is important to ensure a large distance S from the top surface of the mold resin 13 to the second main surface of the element substrate 5 in the interdigital transducer formation region A just below the central portion of the top surface of the mold resin 13 so as to absorb the impact.

The acoustic wave device 100 may be manufactured with a manufacturing method that is generally used to manufacture a known acoustic wave device. To make the thickness dimension X of the center portion, in the width direction, of the interdigital transducer formation region A of the element substrate 5 less than the thickness dimension Y1 of the center portion, in the width direction, of the interdigital transducer non-formation region B1 or less than the thickness dimension Y2 of the center portion, in the width direction, of the interdigital transducer non-formation region B2, the interdigital transducer formation region A is ground deeper than the interdigital transducer non-formation region B1 or the interdigital transducer non-formation region B2 when the element substrate 5 is ground.

Second Preferred Embodiment

Figure 2:
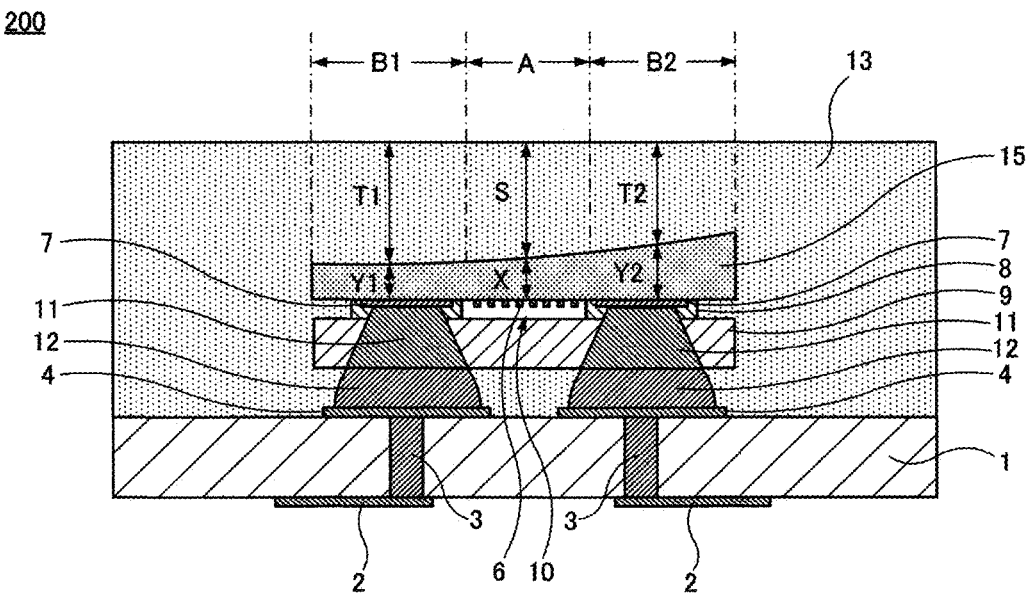
FIG. 2 is a cross-sectional view showing an acoustic wave device 200 according to a second preferred embodiment of the present invention.

FIG. 2 shows an acoustic wave device 200 according to a second preferred embodiment of the present invention. FIG. 2 is a cross-sectional view of the acoustic wave device 200.

The acoustic wave device 200 is modified from the acoustic wave device 100 according to the first preferred embodiment. Specifically, the element substrate 5 of the acoustic wave device 100 is replaced with an element substrate 15 having a different cross-sectional shape. The remaining structure of the acoustic wave device 200 is the same or substantially the same as that of the acoustic wave device 100.

As shown in FIG. 2, the element substrate 15 of the acoustic wave device 200 is structured such that the thickness dimension X of the center portion, in the width direction, of the interdigital transducer formation region A is less than the thickness dimension Y2 of the center portion, in the width direction, of the interdigital transducer non-formation region B2. However, the thickness dimension X of the center portion, in the width direction, of the interdigital transducer formation region A is equal or substantially equal to the thickness dimension Y1 of the center portion, in the width direction, of the interdigital transducer non-formation region B1 or slightly greater than the thickness dimension Y1 of the center portion, in the width direction, of the interdigital transducer non-formation region B1. That is, in the element substrate 15, both of the interdigital transducer formation region A and the interdigital transducer non-formation region B1 have a lower profile than the interdigital transducer non-formation region B2.

The element substrate 15 is bonded, in the interdigital transducer non-formation regions B1, B2, to the cover layer 9 with the support layer 8 interposed therebetween. However, since the thickness of the interdigital transducer non-formation region B2 is sufficiently large, the element substrate 15 has a required mechanical strength.

Even when the acoustic wave device 200 is structured such that the overall dimension in the height direction is reduced by reducing the thickness dimension of the mold resin 13, a sufficiently large distance S from the top surface of the mold resin 13 to the second main surface of the element substrate 15 in the interdigital transducer formation region A is ensured. Therefore, even when information is printed on the top surface, corresponding to the interdigital transducer formation region A, of the mold resin 13 by laser irradiation, laser irradiation does not reach the element substrate 15, and the interdigital transducer formation region A of the element substrate 15 does not melt. Even when impact is exerted on the acoustic wave device 200 when the device is suctioned by a vacuum with a mounter, the impact is absorbed by the mold resin 13, and the element substrate 15 does not break.

Third Preferred Embodiment

Figure 3:
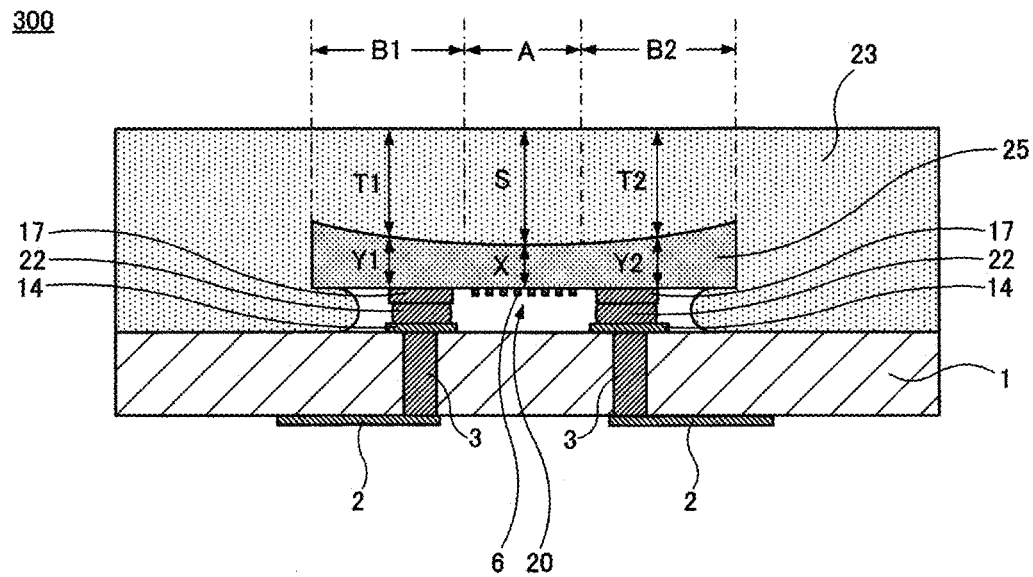
FIG. 3 is a cross-sectional view showing an acoustic wave device 300 according to a third preferred embodiment of the present invention.

FIG. 3 shows an acoustic wave device 300 according to a third preferred embodiment of the present invention. FIG. 3 is a cross-sectional view of the acoustic wave device 300.

The acoustic wave device 300 is modified from the acoustic wave device 100 according to the first preferred embodiment. Specifically, the acoustic wave device 300 does not include the cover layer 9 that the acoustic wave device 100 includes.

The acoustic wave device 300 includes an element substrate 25. The element substrate 25 is the same or substantially the same as the element substrate 5 of the acoustic wave device 100. However, the different reference numeral is assigned for the sake of convenience.

Relatively thick pads 17 are provided on the first main surface (lower main surface) of the element substrate 25. The pads 17 are preferably made of, for example, aluminum.

A bump 22 is provided on each pad 17. The bumps 22 are preferably, for example, solder bumps. The bumps 22 are connected to mounting electrodes 14 provided on the mounting substrate 1, and the element substrate 25 is mounted on the mounting substrate 1.

A mold resin 23 is provided (molded) on the mounting substrate 1 so as to cover the element substrate 25. However, the mold resin 23 does not enter between the mounting substrate 1 and the element substrate 25, and a gap 20 is provided at this portion. The interdigital transducer electrode 6 provided on the element substrate 25 is disposed in the gap 20, and vibrations of the interdigital transducer electrode 6 are not impaired by the mold resin 23. The gap 20 may be provided by adjusting the space between the mounting substrate 1 and the element substrate 25, the type of the resin of the mold resin 23, the viscosity of the resin, the pressure that is applied at the time of molding, or other factors, for example.

In preferred embodiments of the present invention, the structure of the acoustic wave device is selectable, and the cover layer may be omitted as in the case of the acoustic wave device 300. Since the acoustic wave device 300 does not include the cover layer, the acoustic wave device 300 is able to have a lower profile than the acoustic wave device 100.

Fourth Preferred Embodiment

Figure 4:
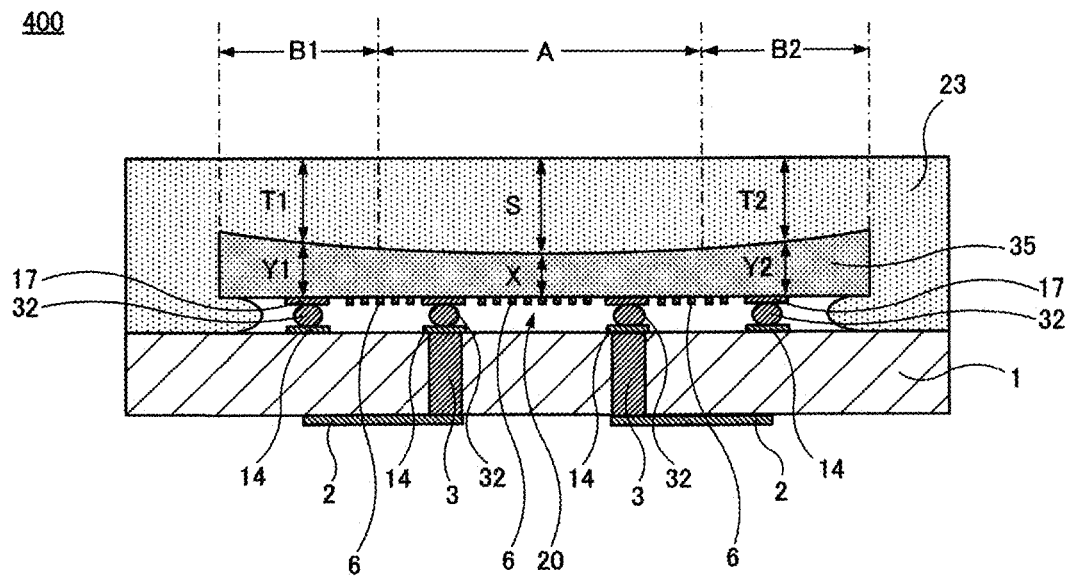
FIG. 4 is a cross-sectional view showing an acoustic wave device 400 according to a fourth preferred embodiment of the present invention.
Figure 5:
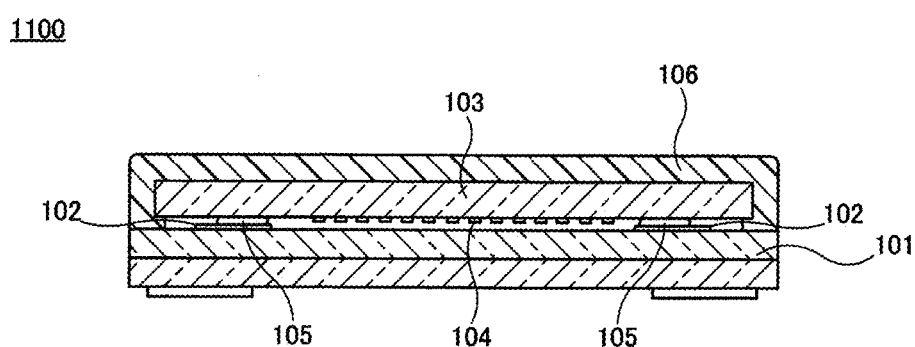
FIG. 5 is a cross-sectional view showing the acoustic wave device 1100 described in Japanese Unexamined Patent Application Publication No. 2009-021559.

FIG. 4 shows an acoustic wave device 400 according to a fourth preferred embodiment of the present invention. FIG. 4 is a cross-sectional view of the acoustic wave device 400.

The acoustic wave device 400 is modified from the acoustic wave device 300 according to the third preferred embodiment. Specifically, in the acoustic wave device 300, the element substrate 25 is mounted on the mounting substrate 1 with the solder bumps 22, while, in the acoustic wave device 400, an element substrate 35 is preferably mounted on the mounting substrate 1 with a large number of gold bumps 32, for example.

The element substrate 35 has a greater dimension in a plane direction than the element substrate 25, and a plurality of the interdigital transducer electrodes 6 are provided on the first main surface.

The remaining configuration of the acoustic wave device 400 is the same or substantially the same as that of the acoustic wave device 300.

The acoustic wave devices 100, 200, 300, 400 according to the first preferred embodiment to the fourth preferred embodiment are described above. However, the present invention is not limited to the above-described preferred embodiments, and various modifications may be made within the scope of the present invention.

For example, in the acoustic wave devices 100, 200, 300, 400, the single element substrate 5, the single element substrate 15, the single element substrate 25, or the single element substrate 35, having piezoelectricity, is mounted on the single mounting substrate 1. Instead, a plurality of element substrates having piezoelectricity may be mounted on the single mounting substrate 1. In this case, the characteristic structure of the present invention just needs to be provided in at least one element substrate, and the scope of the present invention also encompasses such a case.

In addition to the element substrate 5, the element substrate 15, the element substrate 25, or the element substrate having piezoelectricity, an element substrate having no piezoelectricity or an electronic component of another type may be mounted on the mounting substrate 1.

The type, structure, number, and other features, of the interdigital transducer electrode 6 that is provided on the element substrate 5, the element substrate 15, the element substrate 25, or the element substrate 35 are selectable, and different variations may be provided. For example, a plurality of the interdigital transducer electrodes 6 may be provided on the element substrate 5, the element substrate 15, the element substrate 25, or the element substrate 35, and an electronic circuit may be defined by the interdigital transducer electrodes 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    an element substrate having piezoelectricity and including a first main surface and a second main surface;
    an interdigital transducer electrode provided on the first main surface of the element substrate; and
    a mold resin covering at least the second main surface of the element substrate; wherein
    the second main surface of the element substrate is not flat; and
    when viewed in a cross section perpendicular or substantially perpendicular to a top surface of the mold resin, the element substrate includes an interdigital transducer formation region in which the interdigital transducer electrode is provided and a pair of interdigital transducer non-formation regions in which the interdigital transducer electrode is not provided, the interdigital transducer non-formation regions being located on both sides of the interdigital transducer formation region;

a thickness dimension of a center portion, in a width direction, of the interdigital transducer formation region of the element substrate is less than at least one of a thickness dimension of a center portion, in the width direction, of one of the interdigital transducer non-formation regions of the element substrate and a thickness dimension of a center portion, in the width direction, of another one of the interdigital transducer non-formation regions of the element substrate; and a distance from the top surface of the mold resin to the second main surface of the element substrate at the center portion, in the width direction, of the interdigital transducer formation region is greater than at least one of a distance from the top surface of the mold resin to the second main surface of the element substrate at the center portion, in the width direction, of one of the interdigital transducer non-formation region and a distance from the top surface of the mold resin to the second main surface of the element substrate at the center portion, in the width direction, of the other interdigital transducer non-formation region.

2. The acoustic wave device according to claim 1, wherein the thickness dimension of the center portion, in the width direction, of the interdigital transducer formation region of the element substrate is less than the thickness dimension of the center portion, in the width direction, of the one of the interdigital transducer non-formation regions of the element substrate and the thickness dimension of the center portion, in the width direction, of the another one of the interdigital transducer non-formation regions of the element substrate.

3. The acoustic wave device according to claim 1, wherein the top surface of the mold resin is flat.

4. The acoustic wave device according to claim 1, wherein a printed portion is provided on the top surface of the mold resin, corresponding to the interdigital transducer formation region of the element substrate.

5. The acoustic wave device according to claim 1, wherein the element substrate is made of lithium tantalate monocrystal or lithium niobate monocrystal.

6. The acoustic wave device according to claim 1, further comprising:
a cover layer; wherein
the cover layer faces the first main surface of the element substrate; and
a gap is provided between the interdigital transducer electrode and the cover layer.

7. The acoustic wave device according to claim 1, further comprising:
a mounting substrate; wherein the element substrate is mounted on the mounting substrate; and
the mold resin covers the element substrate mounted on the mounting substrate.

8. The acoustic wave device according to claim 7, wherein the mounting substrate is made of ceramics.

9. The acoustic wave device according to claim 7, wherein the mounting substrate is made of alumina.

10. The acoustic wave device according to claim 7, wherein the mounting substrate includes outer electrodes on a lower surface, mounting electrodes on an upper surface, and via conductors extending through the mounting substrate and connecting the outer electrodes and the mounting electrodes; and
the element substrate is mounted on the mounting electrodes.

11. The acoustic wave device according to claim 1, wherein the interdigital transducer electrode is made of a metal selected from Pt, Au, Ag, Cu, Ni, W, Ta, Fe, Cr, Al, and Pd, or an alloy containing at least one of Pt, Au, Ag, Cu, Ni, W, Ta, Fe, Cr, Al, and Pd.

12. The acoustic wave device according to claim 1, further comprising terminal electrodes provided on the first main surface of the element substrate.

13. The acoustic wave device according to claim 12, wherein the terminal electrodes are made of aluminum.

14. The acoustic wave device according to claim 1, further comprising an annular support layer provided on the first main surface of the element substrate and surrounding the interdigital transducer electrode.

15. The acoustic wave device according to claim 14, wherein the annular support layer is made of photosensitive polyimide.

16. The acoustic wave device according to claim 6, wherein the cover layer is made of epoxy resin.

17. The acoustic wave device according to claim 1, wherein the mold layer is made of epoxy resin.

18. The acoustic wave device according to claim 1, wherein the thickness dimension of the center portion, in the width direction, of the interdigital transducer formation region of the element substrate is less than the thickness dimension of the center portion, in the width direction, of the one of the interdigital transducer non-formation regions of the element substrate and is equal or substantially equal to the thickness dimension of the center portion, in the width direction, of the another one of the interdigital transducer non-formation regions of the element substrate.

19. The acoustic wave device according to claim 1, wherein a plurality of the interdigital transducer electrodes are provided on the first main surface of the element substrate.

* * * * *